(12) United States Patent
Suh et al.

(10) Patent No.: US 7,825,585 B2
(45) Date of Patent: Nov. 2, 2010

(54) ORGANIC LIGHT EMITTING DISPLAY

(75) Inventors: Mi-Sook Suh, Suwon-si (KR); Hey-Jin Shin, Suwon-si (KR)

(73) Assignee: Samsung Mobile Display Co., Ltd., Suwon-si, Gyeonggi-do (KR)

(*) Notice: Subject to any disclaimer, the term of this patent is extended or adjusted under 35 U.S.C. 154(b) by 164 days.

(21) Appl. No.: 12/219,261

(22) Filed: Jul. 18, 2008

(65) Prior Publication Data
US 2009/0102364 A1    Apr. 23, 2009

(30) Foreign Application Priority Data
Oct. 22, 2007    (KR) .................. 10-2007-0106122

(51) Int. Cl.
*H01J 1/62*    (2006.01)
*H01J 63/04*    (2006.01)
(52) U.S. Cl. .................. 313/504; 313/498; 313/506
(58) Field of Classification Search .......... 313/498–512
See application file for complete search history.

(56) References Cited

U.S. PATENT DOCUMENTS

| | | | |
|---|---|---|---|
| 5,597,759 A | | 1/1997 | Yoshimori |
| 2001/0024083 A1* | | 9/2001 | Yamazaki et al. ............ 313/483 |
| 2003/0071303 A1* | | 4/2003 | Yamazaki et al. ............ 257/315 |
| 2003/0071576 A1* | | 4/2003 | Koyama .................... 315/169.3 |
| 2003/0214247 A1* | | 11/2003 | Yamazaki et al. ......... 315/169.3 |
| 2005/0258769 A1* | | 11/2005 | Imamura .................... 315/161 |
| 2006/0017672 A1 | | 1/2006 | Aoki |
| 2007/0176548 A1 | | 8/2007 | Kim et al. |
| 2007/0187763 A1 | | 8/2007 | Agari et al. |

FOREIGN PATENT DOCUMENTS

| | | |
|---|---|---|
| CN | 1 938 844 A | 3/2007 |
| CN | 101 009 303 A | 8/2007 |
| KR | 10-0192027 B1 | 1/1999 |
| KR | 10-2003-008345 A | 10/2003 |
| KR | 10/2006-000428 A | 1/2006 |
| KR | 10-2007-0090119 A | 9/2007 |

* cited by examiner

*Primary Examiner*—Bumsuk Won
*Assistant Examiner*—Kevin Quarterman
(74) *Attorney, Agent, or Firm*—Lee & Morse, P.C.

(57) ABSTRACT

An organic light emitting display adapted to be connectable to an external circuit board, the organic light emitting display includes a substrate, a plurality of organic light emitting diodes (OLEDs) on the substrate, and a plurality of input pads coupled with the plurality of OLEDs through wiring lines, the plurality of input pads being connectable to the external circuit board, wherein at least one of the plurality of input pads includes a lead unit extending from a respective one of the wiring lines, and a contact unit contacting the circuit board, and a resistor coupled between the lead unit and the contact unit of the at least one input pad including the lead unit and the contact unit.

20 Claims, 4 Drawing Sheets

ORGANIC LIGHT EMITTING DISPLAY

BACKGROUND OF THE INVENTION

1. Field of the Invention

Embodiments relate to organic light emitting displays. More particularly, embodiments relate to organic light emitting displays including electrostatic discharge (ESD) protection such that the organic light emitting display may be protected against ESD.

2. Description of the Related Art

In general, an organic light emitting display has a self-emission characteristic, larger viewing angle, improved contrast, improved response speed, and lower power consumption than liquid crystal displays (LCDs). Organic light emitting displays do not require a back light, and may be lighter and thinner than LCDs.

Organic light emitting displays generally include a substrate having a pixel region and a non-pixel region, and a container or an encapsulation substrate. The container or the encapsulation substrate may face the substrate so as to encapsulate the substrate, and may be attached to the substrate by a sealant, e.g., epoxy.

A plurality of organic light emitting diodes (OLEDs) coupled between scan lines and data lines, and arranged in a matrix manner, form pixels in the pixel region of the substrate. Portions of scan lines and data lines extending from the scan lines and the data lines of the pixel region, power source supply lines for operating the OLEDs, and a scan driver and a data driver for processing external signals supplied through input pads and supplying the processed signals to the scan lines and the data lines are formed in the non-pixel region.

A film-shaped flexible printed circuit (FPC) (not shown) is electrically coupled with the pad of the organic light emitting display having the above structure. Signals, e.g., power source voltages, scan signals, and data signals, are input from the outside through the FPC.

When the signals are input, via the input pads, to the power source supply lines, the scan driver, and the data driver, the scan driver and the data driver respectively supply the scan signals and the data signals to the scan lines and the data lines. The OLEDs of the pixels selected by the scan signals emit light corresponding to the data signals.

Since the substrate of the organic light emitting display is formed of glass, a relatively large amount of electrostatic discharge (ESD) is generated during manufacturing and/or operation of the organic light emitting display. If the OLEDs and/or driving circuits, which operate at high speed and at a low voltage, are subjected to such ESD, the OLEDs and/or the driving circuits can erroneously operate and/or can be damaged due to the electric influence. When the driving circuits are subjected to the externally generated ESD through internal signal lines, operation of the driving circuits can be instantaneously stopped. As an amount and/or number of occurrences of ESD generation and/or the voltage increases, circuit wiring lines are more likely to be broken or shorted. In general, the driving circuits are more severely damaged by such ESD as the driving circuits are highly integrated (minimized).

SUMMARY OF THE INVENTION

Embodiments of the invention are therefore directed to organic light emitting displays, which substantially overcome one or more of the problems due to the limitations and disadvantages of the related art.

It is therefore a feature of an embodiment of the invention to provide organic light emitting displays capable of effectively preventing and/or reducing electrostatic discharge (ESD) from being received through input pads.

At least one of the above and other features and advantages of the invention may be realized by providing an organic light emitting display adapted to be connectable to an external circuit board, the organic light emitting display including a substrate, a plurality of organic light emitting diodes (OLEDs) on the substrate, and a plurality of input pads coupled with the plurality of OLEDs through wiring lines, the plurality of input pads being connectable to the external circuit board, wherein at least one of the plurality of input pads includes a lead unit extending from a respective one of the wiring lines, and a contact unit contacting the circuit board, and a resistor coupled between the lead unit and the contact unit of the at least one input pad including the lead unit and the contact unit.

The organic light emitting display may include driving circuits coupled between the wiring lines and the OLEDs.

The organic light emitting display may include thin film transistors (TFT) coupled between the driving circuits and the OLEDs.

The resistor may include polysilicon.

An insulating layer may be arranged between the at least one input pad and the resistor, and wherein the resistor is coupled with the contact unit and the lead unit through contact holes formed in the insulating layer.

The circuit board may be a flexible printed circuit (FPC).

When the organic light emitting display is connected to the external circuit board, the contact unit may contact the external circuit board.

When the organic light emitting display is connected to the external circuit board, the contact unit and the lead unit may contact the external circuit board.

The lead unit and the contact unit of the at least one input pad may be spaced apart from each other.

Each of the plurality of input pads may include a lead unit and a contact unit, the lead unit being spaced apart from the corresponding contact unit.

The resistor may be directly coupled between and may directly contact the lead unit and the contact unit of the at least one of the plurality of input pads.

The resistor may include a same material as, and may correspond to a same layer as, source and/or drain regions of the OLEDs.

At least one of the above and other features and advantages of the invention may be realized by providing an organic light emitting display adapted to be connectable to an external circuit board, the organic light emitting display including a substrate, a plurality of organic light emitting diodes (OLEDs) on the substrate, and a plurality of input pads coupled with the plurality of OLEDs through wiring lines, the plurality of input pads being connectable to the external circuit board, wherein each of the plurality of input pads includes a lead unit extending from a respective one of the wiring lines, and a contact unit contacting the circuit board, the lead unit being spaced apart from the contact unit.

When the organic light emitting display is connected to the external circuit board, the circuit board may contact the contact unit and the lead unit of the respective input pads.

A resistor may be coupled between the lead unit and the contact unit of each of the input pads.

The organic light emitting display may include an insulating layer between the lead unit and the contact unit of each of the input pads.

The lead units and the contact units may include a same material and correspond to a same layer as source, drain, anode and/or cathode electrodes of the OLEDs.

The input pads may be arranged along an edge portion of the substrate.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
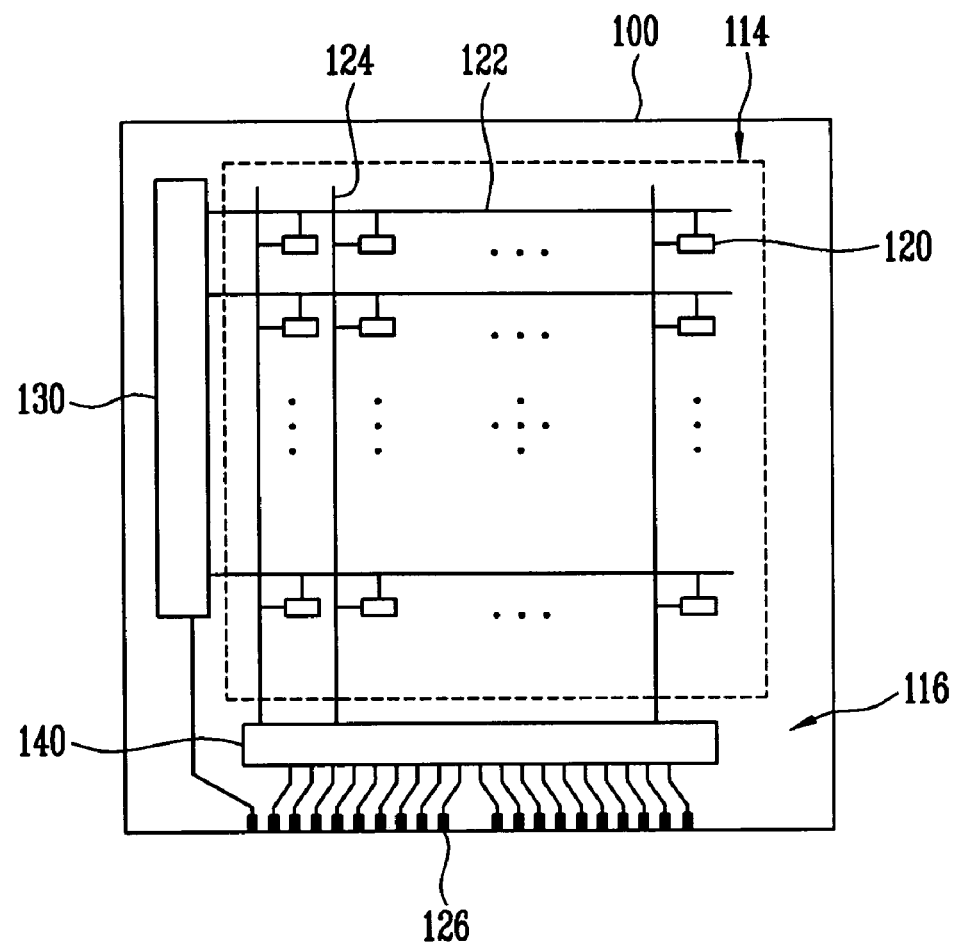
FIG. 1 illustrates a plan view of an organic light emitting display according to an embodiment of the present invention.

Korean Patent Application No. 10-2007-0106122, filed on Oct. 22, 2007, in the Korean Intellectual Property Office, and entitled: "Organic Light Emitting Display," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "between" two elements, it can be the only element between the two layers, or one or more intervening elements may also be present. Like reference numerals refer to like elements throughout the specification.

FIG. 1 illustrates a plan view of an organic light emitting display according to an exemplary embodiment the invention.

Referring to FIG. 1, the organic light emitting display may include a substrate 100, scan lines 122, data lines 124, and organic light emitting diodes (OLEDs) 120, coupled between the scan lines 122 and the data lines 124, in a matrix arrangement. Each of the OLEDs 120, and respective portions of corresponding ones of the scan lines 122, and the data lines 124, may form pixels.

The substrate 100 may include a pixel region 114 and a non-pixel region 116. The scan lines 122 and the data lines 124 may extend across the pixel region 114 and the non-pixel region 116. In the non-pixel region 116, respective portions of the scan lines 122 and the data lines 124, power source supply lines (not shown) for operating the OLEDs 120, a scan driver 130, and a data driver 140 may be formed. The scan driver 130 and the data driver 140 may process external signals supplied through input pads 126, and may supply the processed signals to the scan lines 122 and the data lines 124, respectively.

In a passive matrix type organic light emitting display, the OLEDs 120 may be coupled between the scan lines 122 and the data lines 124 in a matrix arrangement. In an active matrix type organic light emitting display, the OLEDs 120 may be coupled between the scan lines 122 and the data lines 124 in a matrix arrangement together with thin film transistors (TFTs) (not shown) and capacitors (not shown). The TFTs may control operations of the OLEDs 120 and the capacitors may function to maintain signals.

The scan driver 130 and the data driver 140 may be formed on the non-pixel region 116 of the substrate 100. In some embodiments, the scan driver 130 and the data driver 140 may be manufactured during processing of the OLEDs 120. In some embodiments, the scan driver 130 and the data driver 140 may be manufactured as an additional integrated circuit semiconductor chip to be attached to the substrate 100, e.g., via a chip on glass (COG) method or a wire bonding method, and electrically coupled with the scan lines 122 and the data lines 124.

Figure 2:
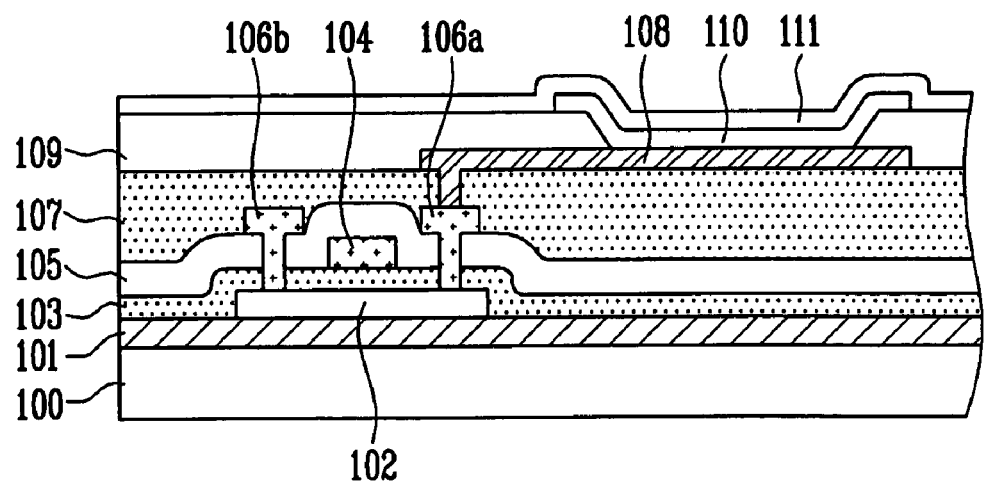
FIG. 2 illustrates a cross-sectional view of the organic light emitting diode (OLED) of FIG. 1.

FIG. 2 illustrates a cross-sectional view of the OLED 120 of FIG. 1, in which an example of the active matrix type OLED is schematically illustrated.

Referring to FIG. 2, the OLED may include a buffer layer 101, a semiconductor layer 102, a gate insulating layer 103, a gate electrode 104, an interlayer insulating layer 105, source and drain electrodes 106a and 106b, a planarizing layer 107, an anode electrode 108, a pixel defining layer 109, an organic thin layer 110, and a cathode electrode 111.

The buffer layer 101 may be formed on the substrate 100. The semiconductor layer 102 may be formed on the buffer layer 101. The semiconductor layer 102 may provide an active layer. More particularly, the semiconductor layer 102 may provide source, drain, and channel regions of the TFTs. The gate insulating layer 103 may be formed on a top surface of the buffer layer 101 and may cover the semiconductor layer 102.

The gate electrode 104 may be formed on the gate insulating layer 103 formed on the semiconductor layer 102. The interlayer insulating layer 105 may be formed on the gate insulating layer 103 and may cover the gate electrode 104. Contact holes may be formed in the interlayer insulating layer 105 and the gate insulating layer 103 to expose predetermined parts of the semiconductor layer 102. The source and drain electrodes 106a and 106b may be coupled with the semiconductor layer 102 through the contact holes formed on the interlayer insulating layer 105.

The planarizing layer 107 may be formed on the interlayer insulating layer 105 to cover the source and drain electrodes 106a and 106b. A via hole may be formed in the planarizing layer 107 so that the source or drain electrode 106a or 106b may be exposed. The anode electrode 108 may be coupled with the source or drain electrode 106a or 106b through the via hole and may be formed on the planarizing layer 107. The pixel defining layer 109 may be formed on the planarizing layer 107. The pixel defining layer 109 may be patterned to expose the anode electrode 108.

The organic thin layer 110 and the cathode electrode 111 may be formed on the anode electrode 108. More particularly, the organic thin layer 110 and the cathode electrode 111 may be formed on the exposed portion of the anode electrode 108. The organic thin layer 110 may be formed to have a structure in which a hole transport layer, an organic light emitting layer, and an electron transport layer are laminated together. The organic thin layer 110 may further include a hole injection layer and an electron injection layer.

Figure 3:
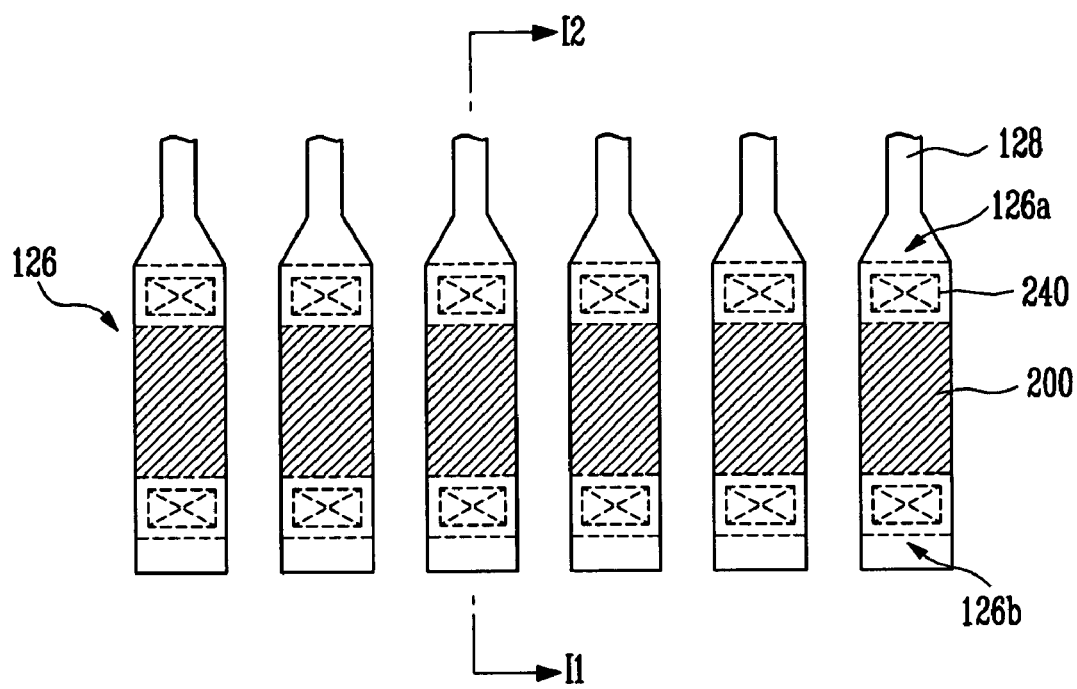
FIG. 3 illustrates a plan view of exemplary input pads of FIG. 1.
Figure 4:
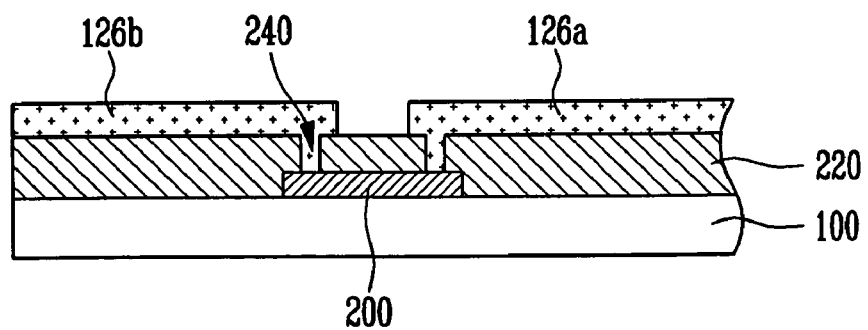
FIG. 4 illustrates a cross-sectional view taken along line I1-I2 of FIG. 3.
Figure 5:
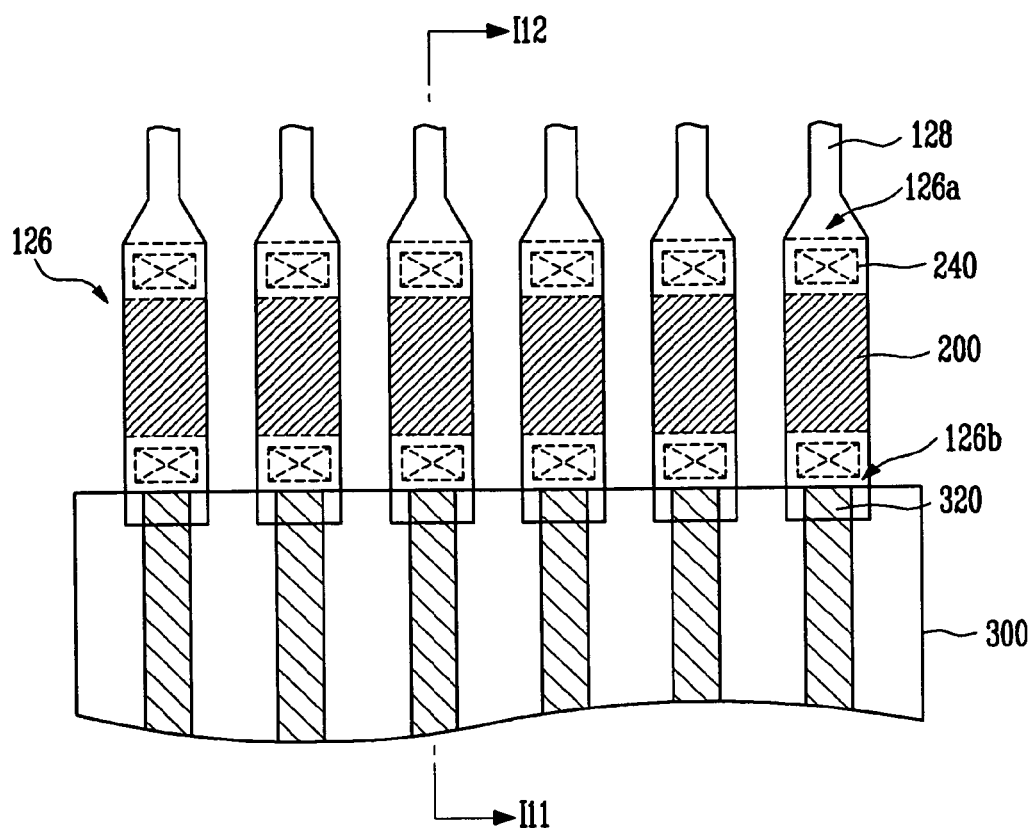
FIG. 5 illustrates a plan view of the exemplary input pads of FIGS. 1 and 3 in a state in which a circuit board contacts respective contact units of the input pads.
Figure 6:
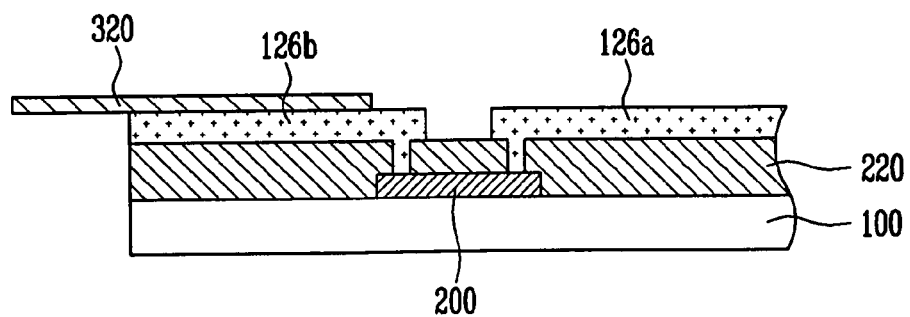
FIG. 6 illustrates a cross-sectional view taken along line I11-I12 of FIG. 5.

FIG. 3 illustrates an enlarged plan view of a portion of the organic light emitting display including the input pads 126. FIG. 4 illustrates a cross-sectional view taken along line I1-I2 of FIG. 3. FIG. 5 illustrates a plan view of exemplary input pads 126 of FIG. 3 in a state in which the external circuit board 300 overlaps and contacts contact portions 126b of the input pads 126, and FIG. 6 illustrates a cross-sectional view taken along line I11-I12 of FIG. 5.

Referring to FIG. 3, the input pads 126 may be arranged on the substrate 100 by a predetermined distance. The input pads 126 may be coupled with driving circuits of the scan driver 130 and the data driver 140 through wiring lines 128.

As discussed above, in organic light emitting displays, the input pads 126 may be formed at an edge portion of the substrate 100, and may be vulnerable to electrostatic discharge (ESD).

In some embodiments of the invention, resistors 200 for preventing and/or reducing over-current from instantaneously flowing due to the ESD may be included in the input pads 126 and/or the input pads 126 may include a plurality of portions, e.g., lead units 126a and contact units 126b. More particularly, in some embodiments, e.g., the input pads 126 may include lead units 126a that extend from the wiring lines 128 and contact units 126b. The contact units 126b may contact pads of an external circuit board 300 (shown in FIGS. 5 and 7). Corresponding pairs of the lead and contact units 126a, 126b may correspond to a respective one of the input pads 126. Further, the lead unit 126a and the corresponding contact unit 126b may be spaced apart from each other, as shown, e.g., in FIGS. 3 and 4.

The resistors 200 may be coupled between the lead units 126a and the contact units 126b. The resistors 200 may be formed of a conductive material, e.g., polysilicon. The resistors 200 may be coupled with the lead units 126a and the contact units 126b through contact holes 240.

Referring to FIG. 4, the resistor 200 may be formed on the substrate 100. The resistor 200 may be formed of, e.g., polysilicon doped to have a predetermined resistance value. An insulating layer 220 may be formed on the substrate 100 where the resistor 200 is formed. The lead units 126a and the contact units 126b may be formed to be coupled with respective ends of the resistor 200 through contact holes 240 formed in the insulating layer 220.

Referring to FIGS. 2 and 4, the resistor 200 may be formed of the same material as the semiconductor layer 102, and may be formed during the process of forming the semiconductor layer 102. The insulating layer 220 may be formed of the gate insulating layer 103 and/or the interlayer insulating layer 105. The lead units 126a and the contact units 126b may be formed of a same electrode material as and during the process of forming the source and drain electrodes 106a and 106b, the anode electrode 108 and/or the cathode electrode 111.

In the exemplary embodiment illustrated in FIG. 5, the external circuit board 300 does not overlap and/or contact the lead units 126a of the input pads 126. However, embodiments are not limited thereto.

Referring to FIGS. 5 and 6, the circuit board 300, e.g., an external circuit board, may be coupled with the input pads 126 of the organic light emitting display having the structure illustrated in FIG. 3. The circuit board 300 may be formed of a film-shaped FPC. The circuit board 300 may include pads 320. The pads 320 of the circuit board 300 may contact the contact units 126b so that signals, e.g., power source voltages, scan signals, and data signals, may be input from the outside.

When the signals are input to the power source voltage supply lines, the scan driver 130, and the data driver 140 through the input pads 126, the scan driver 130 and the data driver 140 may supply the scan signals and the data signals to the scan lines 122 and the data lines 124, respectively. Therefore, the OLEDs 120 of the pixels selected by the scan signals may emit light corresponding to the data signals. That is, when a predetermined voltage is applied to the anode electrode 108 and the cathode electrode 111 of the OLEDs 120 selected by the scan signals, holes injected through the anode electrode 108 and electrons injected through the cathode electrode 111 may be re-combined in the organic thin layer 110 to emit light based on a difference in energy generated by this process. Red, green, or blue light may be emitted from each of the pixels in accordance with materials that form the organic light emitting layer of the respective pixel to realize colors of multi-gray scales.

As described above, in some embodiments of organic light emitting displays according to one or more aspects of the invention, the resistors 200 may be formed in the input pads 126, which may be vulnerable to ESD. Over-current caused by ESD may be reduced and/or prevented from flowing by the resistors 200. In some embodiments, all or substantially all of the over-current caused by ESD may be prevented from flowing by the resistors 200. Only driving signals may be supplied to the organic light emitting display so that the driving circuits and the OLEDs may be safely protected.

In the exemplary embodiment illustrated in FIGS. 3 and 4, the resistors 200 are included in all of the input pads 126. However, embodiments are not limited thereto. For example, in some embodiments, the resistors 200 may be formed only in some of the input pads 126.

Some embodiments may provide organic light emitting displays that may effectively reduce and/or prevent all and/or substantially all ESD from being received to the input pads 126 through the edge of the substrate 100 in a state where the circuit board 300 is not coupled with the input pads 126.

Some embodiments may reduce and/or prevent ESD from being received by the substrate 100, from the outside, including from the circuit board 300, through the input pads 126 or from being received by the circuit board 300 from the substrate 100 through the input pads 126 in a state where the circuit board 300 is coupled with the input pads 126.

Figure 7:
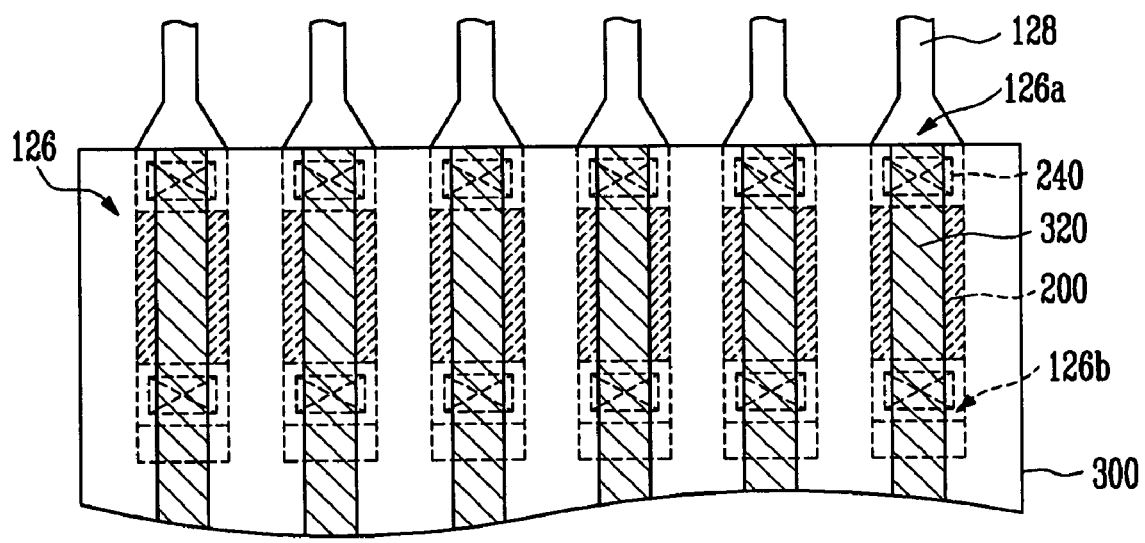
FIG. 7 illustrates a plan view of the exemplary input pads of FIGS. 1 and 3 in a state in which a circuit board contacts contact units and lead units of the input pads.

FIG. 7 illustrates a plan view of the exemplary input pads 126 of FIGS. 1 and 3 in a state in which the circuit board 300 contacts and overlaps respective contact units 126b and lead units 126a of the input pads 126.

Although the resistors 200 are included in the exemplary embodiment illustrated in FIG. 7, in embodiments in which the pads 320 of the circuit board overlap and/or contact the lead units 126a and the contact units 126b of the input pads 126, as shown in FIG. 7, the resistors 200 may be omitted. In such embodiments in which the resistors 200 are omitted, it is possible to prevent wiring line resistance from increasing as a result of the resistors 200.

In conventional cases in which resistors may be formed between input pads and driving circuits, it is possible to protect the driving circuit from the ESD. However, in such cases, the input pads and the external circuit board may be damaged by the ESD.

In some embodiments of the invention, resistors may be formed in input pads of an organic light emitting display so that it is possible to prevent and/or reduce over-current caused by ESD received through the substrate or the external circuit board from flowing to the other. More particularly, in some embodiments, input pads may include lead units and contact units, and resistors may be coupled between the respective lead units and the contact units so that it is possible to effectively prevent and/or reduce ESD from being received by the organic light emitting display and/or the external circuit board. In some embodiments, e.g., it is possible to effectively prevent and/or reduce ESD from being received by the input pads at an edge of the substrate in the state where the circuit board is not coupled with the input pads.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display adapted to be connectable to an external circuit board, the organic light emitting display comprising:
   a substrate;
   a plurality of organic light emitting diodes (OLEDs) and at least one driving circuit on the substrate; and
   a plurality of input pads coupled with the plurality of OLEDs and the at least one driving circuit through wiring lines and connected to the external circuit board,
   wherein at least one of the plurality of input pads includes:
       a lead unit extending from a respective one of the wiring lines coupled to respective OLEDs and the at least one driving circuit, and
       a contact unit contacting the external circuit board,
       at least one resistor disposed between and coupled to the lead unit and the contact unit.

2. The organic light emitting display as claimed in claim 1, wherein the at least one driving circuit on the substrate is coupled between respective wiring lines and OLEDs.

3. The organic light emitting display as claimed in claim 2, further comprising thin film transistors (TFT) coupled between the at least one driving circuit and the OLEDs.

4. The organic light emitting display as claimed in claim 1, wherein the at least one resistor includes polysilicon and is doped to have a predetermined resistance value, such that the at least one of the plurality of input pads including the at least one resistor is protected from electrostatic discharge.

5. The organic light emitting display as claimed in claim 1, wherein:
   an insulating layer is arranged surrounding the at least one resistor, and
   the at least one resistor is coupled with the contact unit and the lead unit through respective contact holes in the insulating layer.

6. The organic light emitting display as claimed in claim 1, wherein the external circuit board is a flexible printed circuit (FPC) directly coupled to the contact unit in the at least one of the plurality of input pads.

7. The organic light emitting display as claimed in claim 1, wherein, when the organic light emitting display is connected to the external circuit board through the plurality of input pads, the contact unit of the at least one of the plurality of input pads directly contacts a pad of the external circuit board.

8. The organic light emitting display as claimed in claim 1, wherein, when the organic light emitting display is connected to the external circuit board through the plurality of input pads, the contact unit and the lead unit of the at least one of the plurality of input pads directly contacts a pad of the external circuit board.

9. The organic light emitting display as claimed in claim 1, wherein the lead unit and the contact unit of the at least one input pad are spaced apart from each other.

10. The organic light emitting display as claimed in claim 2, wherein each of the plurality of input pads includes the lead unit and the contact unit, the lead unit being spaced apart from the corresponding contact unit.

11. The organic light emitting display as claimed in claim 2, wherein the at least one resistor is directly coupled between and directly contacts the lead unit and the contact unit of the at least one of the plurality of input pads.

12. The organic light emitting display as claimed in claim 1, wherein the resistor includes a same material as and corresponds to a same layer as source and/or drain regions of the OLEDs.

13. The organic light emitting display as claimed in claim 1, wherein the plurality of input pads are arranged along an edge portion of the substrate.

14. The organic light emitting display as claimed in claim 2, wherein:
   the at least one of the plurality of input pads includes a first end and a second end, the first end opposing the second end, and the at least one resistor is disposed between the first end and the second end,
   the external circuit board contacts the first end that includes the contact unit,
   the second end that includes the lead unit is coupled to a first end of the respective one of the wiring lines, and
   a second end of the respective one of the wiring lines is coupled with the at least one driving circuit.

15. An organic light emitting display adapted to be connectable to an external circuit board, the organic light emitting display comprising:
   a substrate;
   a plurality of organic light emitting diodes (OLEDs) and at least one driving circuit on the substrate; and
   a plurality of input pads coupled with the plurality of OLEDs and the at least one driving circuit through wiring lines and connected to the external circuit board,
   wherein each of the plurality of input pads includes:
       a lead unit extending from a respective one of the wiring lines coupled to respective OLEDs and the at least one driving circuit,
       a contact unit contacting the external circuit board, the lead unit being spaced apart from the contact unit within the input pad, and
       at least one resistor disposed between and coupled to the lead unit and the contact unit.

16. The organic light emitting display as claimed in claim 15, wherein when the organic light emitting display is connected to the external circuit board through the plurality of input pads, the contact units and the lead units of each input pad contacts a pad of the external circuit board.

17. The organic light emitting display as claimed in claim 15, each input pad includes an insulating layer surrounding the at least one resistor and between the lead unit and the contact unit, the lead unit and the contact unit are coupled to the at least one resistor through respective contact holes in the insulating layer.

18. The organic light emitting display as claimed in claim 15, wherein the lead units and the contact units include a same material and correspond to a same layer as source, drain, anode and/or cathode electrodes of the OLEDs.

19. The organic light emitting display as claimed in claim 15, wherein each the input pads are arranged along an edge portion of the substrate.

20. The organic light emitting display as claimed in claim 15, wherein:
   the at least one driving circuit on the substrate is coupled between respective wiring lines and OLEDs,
   each of the plurality of input pads includes a first end and a second end, the first end opposing the second end, and the at least one resistor is disposed between the first end and the second end,
   the external circuit board contacts the first end that includes the contact unit,
   the second end that includes the lead unit is coupled to a first end of the respective one of the wiring lines, and
   a second end of the respective one of the wiring lines is coupled with the at least one driving circuit.

* * * * *